United States Patent [19]

Hoffman

[11] Patent Number: 4,472,453
[45] Date of Patent: Sep. 18, 1984

[54] PROCESS FOR RADIATION FREE ELECTRON BEAM DEPOSITION

[75] Inventor: Dorothy M. Hoffman, Titusville, N.J.
[73] Assignee: RCA Corporation, New York, N.Y.
[21] Appl. No.: 510,174
[22] Filed: Jul. 1, 1983
[51] Int. Cl.³ .............................................. B05D 3/06
[52] U.S. Cl. ...................................... 427/35; 427/86
[58] Field of Search ................................... 427/35, 86

[56] References Cited

U.S. PATENT DOCUMENTS

| | | | |
|---|---|---|---|
| 3,226,271 | 12/1965 | Hugle et al. | 148/186 |
| 3,420,704 | 1/1969 | Webb | 117/201 |
| 3,554,512 | 1/1972 | Elliott et al. | 263/48 |
| 3,756,847 | 9/1973 | Leibowitz et al. | 117/93.3 |
| 3,864,162 | 2/1975 | Kenty | 117/213 |
| 3,996,469 | 12/1976 | Janes | 250/423 P |
| 4,184,448 | 1/1980 | Aichert et al. | 118/729 |

*Primary Examiner*—Bernard D. Pianalto
*Attorney, Agent, or Firm*—Birgit E. Morris; Donald S. Cohen; James M. Trygg

[57] ABSTRACT

A method for the deposition of thin films on semiconductor devices is disclosed which utilizes electron-beam induced evaporation techniques. A shield device is included for preventing high energy particles, resulting from the use of the electron-beam, from reaching the semiconductor devices being coated.

4 Claims, 3 Drawing Figures

PROCESS FOR RADIATION FREE ELECTRON BEAM DEPOSITION

BACKGROUND OF THE INVENTION

This invention relates to an apparatus and method for the deposition of thin films onto substrates, semiconductor devices, and other objects and more particularly to such apparatus and method wherein electron-beam induced evaporation techniques are utilized.

The art of vacuum depositing thin polycrystaline and amorphous films of conductors, semiconductors, and insulators by evaporation is well known and highly developed. In such apparatus, heating of the melt material is effected in one of three ways, (1) resistance heating, (2) induction heating, and (3) electron-beam impingement. Resistance heating is quite common and usually involves a resistance heating element embedded in, or wrapped around a cup shaped holder. A crucible, or other container suitably shaped to hold the material to be evaporated is placed within the cup shaped holder and is arranged to transfer heat from this holder to the melt sufficient to cause evaporation. U.S. Pat. No. 3,864,162, issued Feb. 4, 1975 to Kenty, discloses a deposition apparatus that utilizes this type of heating. Induction heating is less common than resistance heating and usually involves an induction coil suitably arranged with respect to the material to be evaporated. An alternating current is used to excite the induction coil thereby inducing heat within the material to be evaporated. Heating by electron-beam impingement, on the other hand, is in widespread use. With this method, a beam of electrons is generated by an electron-beam gun and directed toward the melt by magnetic fields. The electrons impinge upon the surface of the material to be evaporated causing very high localized temperatures. This method of heating offers several advantages over other methods including precise control of the power output of the electron-beam and precise placement thereof and economy of power consumption. For an example of this type of heating device the reader is referred to U.S. Pat. No. 3,996,469 issued Dec. 7, 1976 to James. A variety of high energy particles, such as x-rays, are emitted when the electrons from the electron beam impinge upon the melt. These particles, of course, have direct access to the surface of the device being coated and, under certain circumstances, may alter the characteristics of the device. Therefore, a disadvantage of this type of heating is that its application must be limited to semiconductor devices or other objects that are not sensitive to high energy particles.

As the state-of-the-art in semiconductor technology advances, the new thin film and closely packed monolithic integrated circuit devices are becoming more intolerant to radiation exposed thereto during the manufacturing process. What is needed is an apparatus that prevents these high energy particles from reaching the object being coated during deposition.

SUMMARY OF THE INVENTION

According to the present invention a coating apparatus is disclosed for coating substrates or other objects utilizing electron-beam heating and evaporation techniques. A vacuum chamber is provided having interior walls defining a subatmospheric volume consisting of first and second subchambers. A substrate holder is disposed within the first subchamber and arranged to hold a substrate or other object to be coated. A shield means having an aperture formed therethrough is provided for inhibiting movement of high energy particles from the second subchamber to the first subchamber. A crucible means having an interior cavity is provided for holding a melt which is to be evaporated. The crucible means has one open side communicating with the interior cavity and is arranged within the second subchamber so that the open side is in registry with the aperture. The interior cavity of the crucible means is thereby in direct communication with only the first subchamber. An electron-beam generator means is disposed within the second subchamber for generating and directing a beam of electrons so that they impinge upon the crucible means only within the second subchamber thereby inducing heat in the crucible means and the melt.

DESCRIPTION OF THE PREFERRED EMBODIMENT

Figure 1:
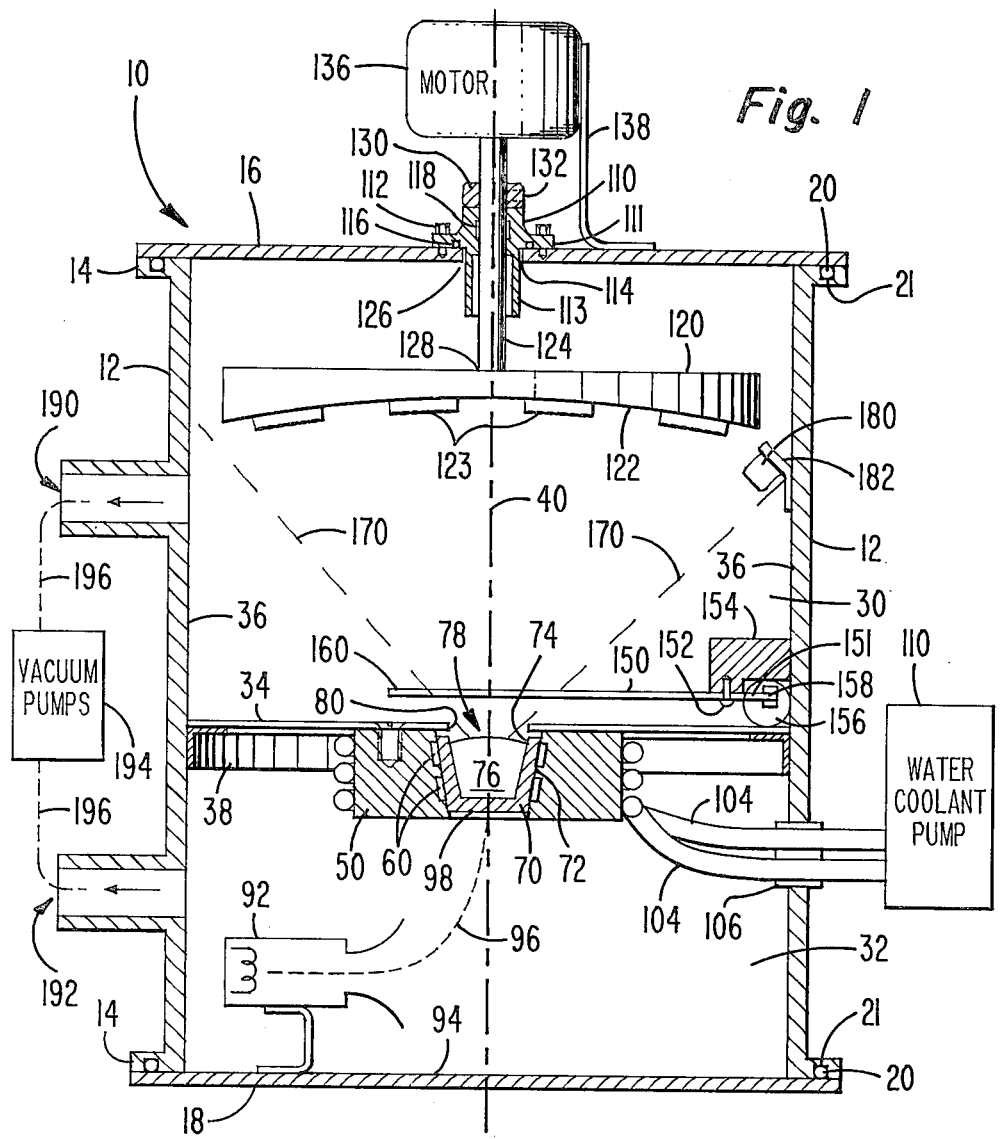
FIG. 1 is a cross-sectional view of a vacuum chamber showing a crucible holder and shield embodying the teachings of the present invention.

There is shown in FIG. 1 a vacuum chamber 10 having side walls 12, a pair of flanges 14, one being formed at each end of the side walls 12, a top cover 16, and a bottom cover 18. The top and bottom covers 16,18 are sealed to their respective flanges 14 by suitable gaskets 20, or "O" rings, which are arranged within the grooves 21 formed in the periphery of the flanges 14 in a manner well known in the art. The interior of the chamber 10 comprises a first subchamber 30 and a second subchamber 32 which are separated by a stainless steel shield plate 34. The shield plate 34 is supported on an angle member 38 which is arranged around the periphery of the inner wall 36 of the chamber 10, and optionally, the plate is disposed perpendicular to a vertical axis 40 of the chamber 10, as shown in FIG. 1. It is not intended that the shield plate 34 provide a seal between the first and second set chambers 30 and 32. Therefore, the shield plate 34 need not extend to the side walls 12 and the angle member 38 may be segmented or formed in a spider-like structure that supports the plate 34 at discrete points around its periphery. The angle member 38 may be attached to the inner wall 36 by means of weld or suitable screw fasteners which are not shown. Additionally, the plate 34 may be attached to the angle member 38 by suitable screw fasteners or simply left resting thereon.

Figure 2:
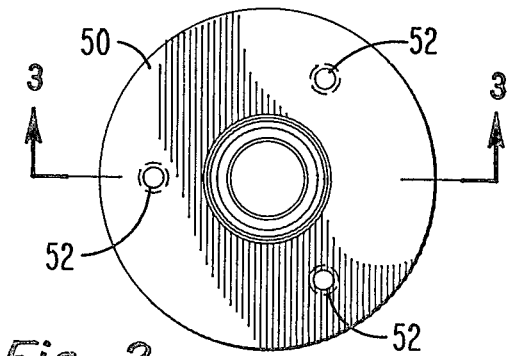
FIG. 2 is a plan view of the crucible holder shown in FIG. 1.
Figure 3:
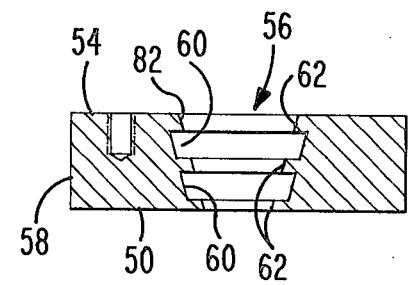
FIG. 3 is a cross-sectional view taken along the lines 3—3 as shown in FIG. 2.

A crucible holder 50, shown in FIGS. 2 and 3, has three spaced apart threaded holes 52 formed in the top surface 54 thereof and a tapered hole 56 formed therethrough, axially and concentric to the outer periphery 58. The tapered hole 56, best seen in FIG. 3, has two undercuts 60 formed therein resulting in three annular lands 62. A cup shaped crucible 70, having an outer surface 72 which closely approximates the angle of taper of the tapered hole 56 is dimensioned so that it loosely nestles into the hole 56, thereby contacting the annular lands 62. The lands 62 serve the dual purpose of providing vertical support for the crucible 70 and providing a pathway by which heat may be conducted away from the crucible 70. For this reason, the crucible holder 50 is made of copper or a copper alloy having high heat conductivity characteristics. The crucible 70 may be made of vitreous carbon, which was successfully tested in the apparatus described herein. Alternatively, the crucible 70 may be made of an intermetallic compound such as titanium diboride-boron nitride or a non-metallic compound such as boron nitride. The crucible 70 has an interior cavity 74 for holding a melt or charge of material 76 to be evaporated and a single open side 78. The open side 78 is arranged to face upwardly and be in registry with an opening 80 formed in the plate 34 substantially on the vertical axis 40 of the chamber 10. The opening 80 overhangs the outer most edge 82 of the tapered hole 56 to inhibit passage of or trap any high energy particles that may attempt to migrate from the second subchamber to the first subchamber along the path or abutting joint between the crucible 70 and the lands 62 of the crucible holder 50.

An electron-beam gun 92, such as that manufactured by the Denton Vacuum Company of Cherry Hill N.J., is attached to the inside surface 94 of the bottom cover 18 as shown in FIG. 1. The specific details of mounting and of suitable power and cooling interconnections required for the gun 92 are well known in the art and, therefore, are omitted here. Note, however, that the model of gun that is used has an electron-beam that is deflected approximately 90° rather than the customary 270°. The gun 92 is positioned so that the electron beam 96 will impinge on the under surface 98 of the crucible 70 thereby heating the crucible and the melt 76. Very high temperatures are generated in this way and must be dissipated somewhat to prevent deforming or melting of the lands 62 that contact the sides of and support the crucible 70. To accomplish this purpose, two or three turns of copper tubing 102 are wound tightly around the periphery 58 of the holder 50 and connected to a coolant pump 110 via the conduits 104. The coolant pump circulates water through the tubing 102 thereby drawing heat away from the holder 50 and, more importantly, away from the lands 62. The conduits 104 exit the second subchamber through a suitable sealing connection 106 that is well known in the art.

A rotatable substrate holder 120 having a concave, or arcuate, surface 122 upon which the substrates 123, which are to be coated, are mounted is disposed in the top portion of the first subchamber 30. A rotary shaft feed through 110 having a mounting flange 111 is bolted to the top cover 16 by a plurality of bolts 112 which are threaded into blind holes formed in the top cover 16. The feed through 110 has a hub 113 projecting through an opening 114 formed in the top cover 16 coincident with the axis 40 of the chamber 10. An "O" ring 116 is disposed between the mounting flange 111 and the top cover 16 for providing a good vacuum seal. A suitable shaft seal element 118 is disposed within the bore of the feed through 110 through which the shaft 124 projects. The feed through 110 described above is well known in the art and is commercially available through MRC Corporation of Orangeburg, N.Y. The shaft 124 is rigidly fastened to the center of the holder 120 at 128 and its axis is substantially coincident with the axis 40 of the chamber 10. A collar 130 is adjustably attached, via a set screw 132, to the shaft 124 for supporting the weight of the shaft and substrate holder in the vertical direction. A gear head motor 136 having a mounting bracket 138 is attached with suitable screw fasteners, not shown, to the top cover 16 and arranged with the axis of its output shaft in alignment with the axis of the shaft 124.

The shaft 124 may either be an extension of the output shaft of the motor 136 or coupled to the output shaft via any suitable rotational coupling arrangement, several of which are well known in the art. The output shaft of the motor 136 is geared down to rotate between sixty and one hundred RPM.

A shutter 150, comprising an elongated plate of stainless steel, is arranged within the first subchamber 30 substantially parallel to the shield plate 34. One end 151 of the shutter 150 is pivotally attached to a bracket 154 at a point 152, the bracket 154 being rigidly attached to the inner wall 36 of the chamber 10. A linear actuator 156, such as an air cylinder, is disposed within the first subchamber 30, the output shaft of which is pivotally attached at 158 to the end 151 of the shutter 150 adjacent the point 152. The other end 160 of the shutter 150 is arranged so that it vertically covers, and overhangs by a substantial amount, the interior cavity 74 of the crucible 70 when the linear actuator 156 is in one position and is completely clear of the interior cavity 74 when the linear actuator is in another position. The purpose of the shutter 150 is to block any evaporants so that they do not reach the substrates 123 while the system is stabilizing during start up. Once the stabilization temperature is reached, approximately 900° C. for aluminum evaporant, the linear actuator 156 is made to pivot the shutter 150 toward one side of the interior cavity 74 until the shutter is completely out of the line of sight path 170 of the evaporant.

A monitor device 180 is mounted to the interior wall 36 by means of a mounting bracket 182 and screw fasteners, not shown. The monitor 180 is positioned so that it is well within the path of the evaporant but does not interfere with evaporant moving toward the substrates. The monitor 180 comprises a crystal which produces energy output of known characteristics when excited by a known power source and exposed to evaporant of a known composition. Should the composition of the evaporant change for any reason, for example, should the crucible crack, the energy output characteristics of the crystal would correspondingly change; thereby alerting an operator to the existence of a malfunction.

A pair of ports 190 and 192 are formed in the side wall 12 of the chamber 10 and are arranged to communicate with the first and second subchambers 30 and 32 respectively, as shown in FIG. 1. The ports 190,192 are connected to a vacuum pump 194 by the conduits 196 so that both subchambers 30 and 32 can be evacuated to a suitable subatmospheric pressure prior to initiation of the evaporation and coating process. Details of the vacuum pump and its interconnection with the chamber 10 are well known in the art and need not be further explained here.

In operation, a quantity of material to be evaporated, say aluminum, is placed within the cavity 74 of the crucible 70. The shutter 150 is positioned so that any evaporant leaving the melt 76 will be blocked. Substrates 123 or other articles to be coated are attached to the surface 122 of the holder 120 by suitable spring clips or clamps, neither of which are shown, and the top cover 16 is lowered in place on the flange 14 as shown in FIG. 1. The vacuum pumps 194 are then operated until the pressure within the two subchambers reaches approximately $10^{-5}$ to $10^{-6}$ torr. The coolant pump is then operated and water circulated through the coils of copper tubing 102. The electron-beam gun is then energized so that the melt 76 begins to absorb heat. When the temperature of the melt 76 reaches a predetermined level, that which permits an acceptable rate of evaporation of the melt material, the motor 136 is energized and the holder 120 accelerated to about 60 to 100 RPM. The shutter 150 is then moved to the position where it is completely clear of all line of sight paths between the melt 76 and the substrate hoder 120. When the desired thickness of coating is obtained the coating operation is terminated by carrying out the above procedural steps in reverse order. That is, the shutter 150 is closed, the motor 136 de-energized and stopped, the electron-beam gun de-energized, and after a suitable delay, the coolant pump turned off. The chamber 10 is then cooled to room temperature and vented with $N_2$ gas prior to the opening and removal of the coated articles.

This invention provides for a novel apparatus and method for the deposition of thin films onto semiconductor substrates while shielding the substrates from high energy particles resulting from use of an electron-beam to heat the evaporant. This permits the manufacture of radiation sensitive semiconductor devices heretofore thought not possible and will result in more closely packed monolithic integrated circuit devices.

I claim:

1. A method of depositing thin films in the formation of semiconductor devices comprising the steps of:
   (a) placing a substrate and a crucible containing a quantity of material to be evaporated in a chamber having a partial vacuum;
   (b) generating a beam of electrons;
   (c) directing said beam of electrons to impinge upon said crucible thereby heating and evaporating said material contained therein and depositing said material on said substrate; and
   (d) shielding said substrate and said material being deposited from exposure to high energy particles that result from steps (b) and (c).

2. The method of claim 1 wherein step (a) includes placing said crucible in a crucible holder and cooling said crucible holder.

3. The method of claim 2 wherein:
   Step (a) includes placing said substrate in a first subchamber comprising a portion of said chamber;
   Step (b) includes said generating a beam of electrons in a second subchamber comprising another portion of said chamber;
   Step (c) includes said directing said beam of electrons to impinge upon said crucible in said second subchamber; and
   Step (d) includes preventing movement of said high energy particles from said second subchamber to said first subchamber.

4. The method of claim 3 including the step of rotating said substrate within said chamber during steps (b) through (d).

* * * * *